United States Patent
He (10) Patent No.: US 10,250,242 B2
(45) Date of Patent: Apr. 2, 2019

(54) ARBITRARY DELAY BUFFER

(71) Applicant: Chengming He, Chandler, AZ (US)

(72) Inventor: Chengming He, Chandler, AZ (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/089,138

(22) Filed: Apr. 1, 2016

(65) Prior Publication Data
US 2017/0288655 A1   Oct. 5, 2017

(51) Int. Cl.
| H03K 5/133 | (2014.01) |
| H03K 5/15 | (2006.01) |
| H03K 3/03 | (2006.01) |
| H03K 5/1534 | (2006.01) |
| H03K 21/02 | (2006.01) |
| H03K 5/131 | (2014.01) |
| H03K 5/00 | (2006.01) |

(52) U.S. Cl.
CPC ....... *H03K 5/15026* (2013.01); *H03K 3/0315* (2013.01); *H03K 5/131* (2013.01); *H03K 5/1534* (2013.01); *H03K 21/02* (2013.01); *H03K 3/0322* (2013.01); *H03K 2005/00247* (2013.01)

(58) Field of Classification Search
None
See application file for complete search history.

(56) References Cited

U.S. PATENT DOCUMENTS

| 5,708,381 A * | 1/1998 | Higashisaka | H03K 5/131 327/142 |
| 7,911,250 B2 * | 3/2011 | Okubo | G11C 7/1066 327/263 |
| 2006/0017480 A1 * | 1/2006 | Lin | H03H 11/265 327/158 |
| 2010/0123494 A1 * | 5/2010 | Heightley | G11C 7/1051 327/158 |
| 2010/0134169 A1 * | 6/2010 | Okubo | G11C 7/1066 327/263 |
| 2014/0139277 A1 * | 5/2014 | Subramanian | H03L 7/0812 327/158 |

* cited by examiner

*Primary Examiner* — Cassandra F Cox
(74) *Attorney, Agent, or Firm* — Tracy Parris (57) ABSTRACT

A signal may be arbitrarily delayed in discrete steps by an arbitrary delay buffer having an analog delay and a digital delay. An analog delay may have a number of selectable delay stages (e.g. ring oscillator with VCDL stages). A digital delay may have rising and falling edge detectors, resettable ring oscillators that oscillate in response to rising or falling edges and counters to count oscillations and generate rising and falling edge delay signals when oscillation counts reach rising and falling edge delay counts. A resettable ring oscillator may have a resettable stage (e.g. VCDL) that may be enabled and disabled. Selection of one or both digital and analog delays and respective delay times may be based on one or more characteristics. For example, an analog delay may delay an input signal or a delayed input signal received from the digital delay based on input signal frequency or total delay.

20 Claims, 6 Drawing Sheets

ARBITRARY DELAY BUFFER

CROSS-REFERENCE TO RELATED APPLICATIONS

This application is related to U.S. patent application Ser. No. 14/887,663, filed Oct. 20, 2015, entitled "INTEGRATED CIRCUITS HAVING LOW POWER, LOW INTERFERENCE AND PROGRAMMABLE DELAY GENERATORS THEREIN AND METHODS OF OPERATING SAME," which is hereby incorporated by reference in its entirety as if fully set forth herein.

BACKGROUND

Precision timing in communication and network clock distribution systems may use, for example, a global positioning system (GPS) pulse per second (PPS) signal (waveform). Low duty cycle and low frequency operation of a distributed PPS signal may result in rising and falling edges being phase shifted at different nodes (e.g. receivers), for example, due to different wire routing and impedance mismatches. For example, edges may be phase-shifted 3 to 20 ns, e.g., depending on routing to various receivers. Phase shifts may lead to increased bit-error-rate (BER).

SUMMARY

This Summary is provided to introduce concepts in a simplified form. These concepts are described in greater detail below in the sections entitled Detailed Description, Brief Description of the Drawings, Claims, and in the figures. This Summary is not intended to identify key or essential features of the described or claimed subject matter, nor limit the scope thereof.

Systems, methods, and instrumentalities are disclosed for an arbitrary delay buffer. A signal (e.g. 1 PPS signal) may be arbitrarily delayed in discrete steps (e.g. to a full cycle). A signal may be arbitrarily delayed in discrete steps by an arbitrary delay buffer having one or more arbitrary delay generators with one or more inputs and outputs, which may be independently delayed. An arbitrary delay buffer may have an analog delay and a digital delay. An analog delay may have a number of selectable delay stages (e.g. ring oscillator with VCDL stages). A digital delay may have rising and falling edge detectors, resettable ring oscillators that oscillate in response to rising or falling edges and counters to count oscillations and generate rising and falling edge delay signals when oscillation counts reach rising and falling edge delay counts, which may be selected to maintain a duty cycle and a period of the input signal in the delayed signal. Selection of one or both of the digital and analog delays and their respective delay times to delay a signal may be based on one or more characteristics. For example, an analog delay may selectively receive an input signal or a delayed input signal from the digital delay for original or additional delay based on input signal frequency or total delay. A resettable ring oscillator may have one or more stages (e.g. VCDLs) that may be enabled and disabled. Ring oscillators or stages therein in analog and digital delays may be calibrated, for example, by adjusting reference voltages based on calibration of replica ring oscillators or stages.

BRIEF DESCRIPTION OF THE DRAWINGS

The drawings, summary, detailed description and claims individually and collectively present non-limiting examples. Each figure represents a different example with different numbering.

DETAILED DESCRIPTION

A detailed description of illustrative embodiments will now be described with reference to the various Figures. Although this description provides examples of possible implementations, it should be noted that details provided in examples are intended to be exemplary and in no way limit the scope of the application. The present technology may be practiced without these specific details. The present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example embodiment," or the like, indicate that the embodiment described may include a particular feature, structure, characteristic or step, but every embodiment may not necessarily include the particular feature, structure, characteristic or step. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

Unless specifically stated otherwise, terms such as "sampling," "latching," "determining," "selecting" "storing," "registering," "creating," "including," "comparing," "receiving," "providing," "generating," "associating," and "arranging", or the like, refer to the actions and processes of an electronic device that manipulates and transforms data represented as physical (electronic) quantities within the electronic device. The terms "logic," "function," "step," and the like refer to functionality that may be implemented by hardware (digital and/or analog) or a combination of hardware, software and/or firmware. Unless specifically indicated, described and claimed functionality may be implemented by hardware (digital and/or analog) or a combination of hardware, software and/or firmware. The term "programmable" and the like refer to functionality permitting definition or selection of functionality to vary performance of logic from one embodiment to the next, whether one-time or any number of times such as by reprogrammable functionality. Logic may be referred to as being enabled, disabled, high, low, on, off and the like.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or through an indirect electrical connection via other devices and connections. Furthermore, the term "information" is intended to refer to any data, instructions, or control sequences that may be communicated between components of a device. For example, if information is sent between two components, data, instructions, control sequences, or any combination thereof may be sent between the two components. The terms constant, substantially constant, maintain and substantially maintain are used interchangeably to have the same meaning of constant +/−10% variation. Maintenance of an impedance value permits some variation from the impedance value, but considerably less variation than impedance glitches during normal switching.

Systems, methods, and instrumentalities are disclosed for an arbitrary delay buffer. A signal (e.g. 1 PPS signal) may be arbitrarily delayed in discrete steps (e.g. to a full cycle). A signal may be arbitrarily delayed in discrete steps by an arbitrary delay buffer having one or more arbitrary delay generators with one or more inputs and outputs that may be independently delayed. An arbitrary delay buffer may have an analog delay and a digital delay. An analog delay may have a number of selectable delay stages (e.g. ring oscillator with VCDL stages). A digital delay may have rising and falling edge detectors, resettable ring oscillators that oscillate in response to rising or falling edges and counters to count oscillations and generate rising and falling edge delay signals when oscillation counts reach rising and falling edge delay counts, which may be selected to maintain a duty cycle and a period of the input signal in the delayed signal. Selection of one or both of the digital and analog delays and their respective delay times to delay a signal may be based on one or more characteristics. For example, an analog delay may selectively receive an input signal or a delayed input signal from the digital delay for original or additional delay based on input signal frequency or total delay. A resettable ring oscillator may have one or more stages (e.g. VCDLs) that may be enabled and disabled. Ring oscillators or stages therein in analog and digital delays may be calibrated, for example, by adjusting reference voltages based on calibration of replica ring oscillators or stages.

In an example, an apparatus may comprise a digital delay configured to receive an input signal and an analog delay configured to selectively receive, based on a selection signal, one of the input signal and an output of the digital delay. A selection signal may select between application of one and both the analog delay and the digital delay to the input signal. A digital delay may comprise an edge detector configured to receive the input signal, a resettable ring oscillator coupled to an output of the edge detector and a counter coupled to an output of the resettable ring oscillator.

In an (e.g. another) example, an apparatus may comprise a digital delay configured to delay an input signal. The digital delay may comprise an edge detector that detects at least one of a rising edge and a falling edge (a detected edge) of the input signal; a ring oscillator that oscillates in response to the detected edge; and a counter that counts the number of oscillations of the ring oscillator in response to the detected edge and generates a delay signal when the count reaches a delay count that determines the duration of the oscillation. A delayed input signal generator may be configured to generate a delayed version of an input signal (a delayed input signal) in response to the first and second delay signals. A delayed input signal generator may comprise a set-reset flip flop that receives the first delay signal as a set signal and the second delay signal as a reset signal.

In an example, an edge detector may comprise a rising edge detector that detects a rising edge of the input signal and a falling edge detector that detects a falling edge of the input signal. In an example, a ring oscillator may comprise a first ring oscillator that oscillates in response to the detected rising edge and a second ring oscillator that oscillates in response to the detected falling edge. In an example, a counter may comprise a first counter that counts a number of oscillations of the first ring oscillator and generates a first delay signal when the count reaches a first delay count and a second counter that counts the number of oscillations of the second ring oscillator and generates a second delay signal when the count reaches a second delay count. A first delay count and a second delay count may be programmed to maintain a duty cycle and a period of the input signal in the delayed input signal.

A ring oscillator may be resettable. A resettable ring oscillator may comprise a resettable oscillator stage configured to be enabled and disabled responsive to an enable signal. A resettable oscillator stage may comprise a voltage controlled delay line (VCDL). A multiplexer in a VCDL may be configured to be enabled and disabled responsive to the enable signal. A calibration circuit may calibrate a replica VCDL. Calibration may be affect control of the VCDL in the resettable oscillator stage.

An analog delay may be configured to delay an input signal or a digitally delayed version of an input signal. A multiplexer may receive as inputs the input signal and one of the delayed input signal and the delay signal generated by the counter. An analog delay may be configured to selectively delay one of the input signal and the delayed input signal or delay the input signal based on the delay signal generated by the counter. A controller may select between application of an analog delay and a combination of the analog delay and the digital delay to the input signal.

In an example, an operation procedure may comprise selecting between application of an analog delay and a combination of the analog delay and a digital delay to an input signal and applying the selected delay to the input signal. Selection may be based on a frequency of the input signal or a length of a delay applied to the input signal. A number of analog delay stages in the analog delay and/or a delay count for the counter in the digital delay may be selected or predefined. The ring oscillator may be operated and reset, for example, by enabling and disabling the ring oscillator or a ring oscillator stage in the ring oscillator.

Application of the selected delay to the input signal may comprise applying, based on the selection, the digital delay by: detecting at least one of a rising edge and a falling edge (a detected edge) of the input signal; oscillating, by a ring oscillator, in response to the detected edge; counting a number of oscillations of the ring oscillator in response to the detected edge and generating a delay signal when the count reaches a delay count.

Application of the selected delay to the input signal may comprise applying, based on the selection, the analog delay by: applying at least one of a plurality of analog delay stages in the analog delay: (i) to the input signal, (ii) to the input signal based on the delay signal or (iii) to a delayed version of the input signal generated based on the delay signal.

Figure 1:
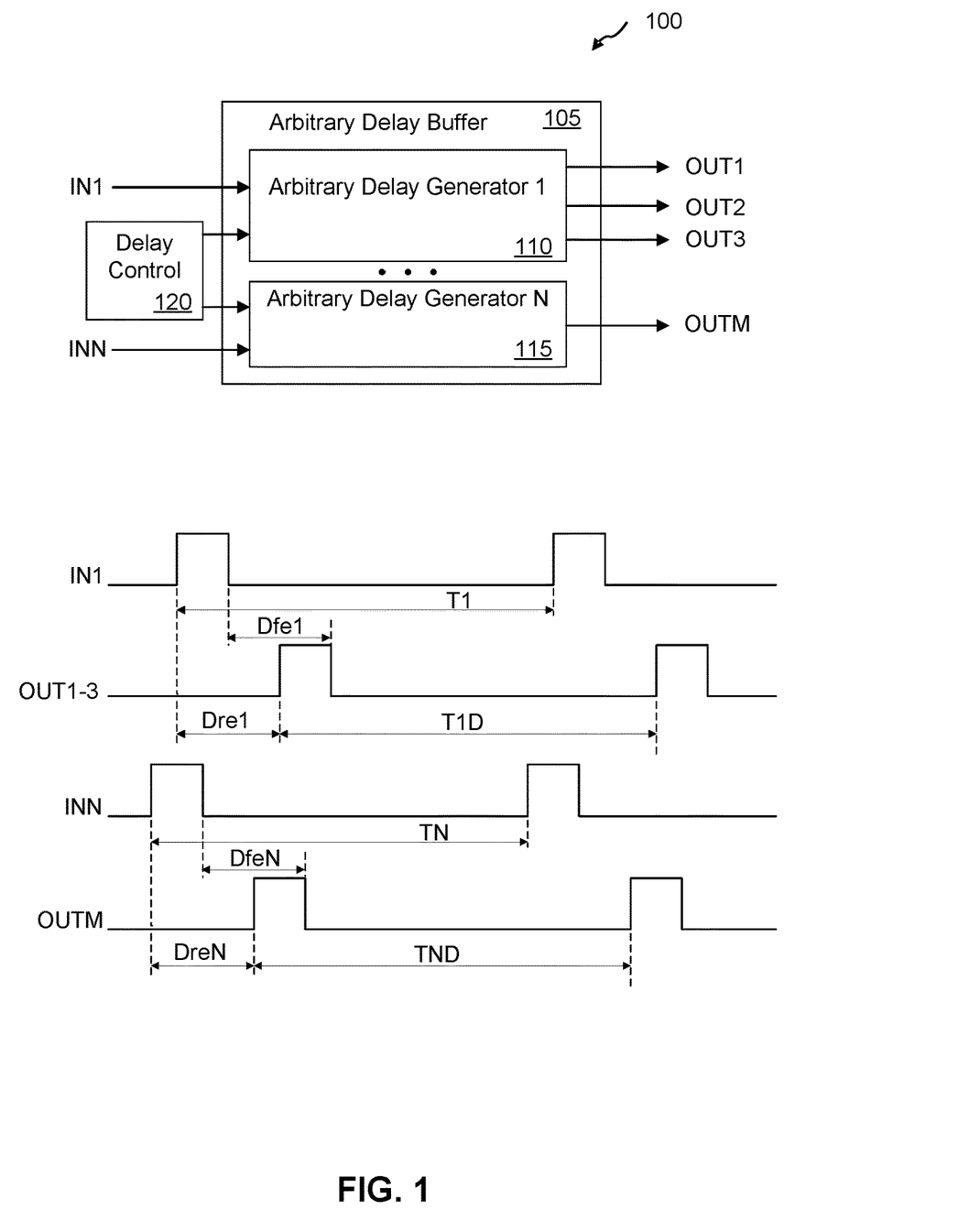
FIG. 1 is an example of an arbitrary delay buffer with one or more arbitrary delay generators having one or more inputs and outputs.

FIG. 1 is an example of an arbitrary delay buffer with one or more arbitrary delay generators having one or more inputs and outputs. An arbitrary delay buffer may implemented, for example, as a centralized and/or distributed component (e.g. under system calibration and operational control) to synchronize a phase of signals (e.g. clocks), such as a PPS signal distributed to subsystems. An arbitrary delay buffer may have any number of signal inputs, signal outputs and control signals.

In the example shown in FIG. 1, arbitrary delay buffer 105 comprises arbitrary delay generator 1 110 through arbitrary delay generator N 115. An arbitrary delay buffer may have any number of arbitrary delay generators. Arbitrary delay buffer 105 receives inputs IN1 through INN. An arbitrary delay buffer may receive any number of inputs. Arbitrary delay buffer 105 provides output signals OUT1 through OUTM. An arbitrary delay buffer may provide any number of outputs. Outputs may be dependently and/or independently controlled to provide signals with and without various delays relative to respective input signal(s), e.g., to compensate for various differences in routing output signals to respective subsystems. Arbitrary delay buffer 105 may comprise other functions or components not shown in FIG. 1.

Arbitrary delay buffer 1 110 receives first input signal IN1 and provides first through third output signals OUT1, OUT2 and OUT3. An arbitrary delay generator may have any number of input and output signals. Output signals OUT1-3 may each be independently delayed or two or more may be dependently delayed. In the example shown in FIG. 1, first input signal IN1 has a first period T1 with a low duty cycle, such as a PPS signal. Output signals OUT1-3 have a rising edge delayed from first input signal IN1 rising edge by first rising edge delay Dre1. Output signals OUT1-3 have a falling edge delayed from first input signal IN1 falling edge by first falling edge delay Dfe1. Output signals OUT1-3 have a period T1D. In various implementations, a period and/or a duty cycle or pulse width of an input signal may be maintained or modified in one or more output signals. Rising and falling edge delays Dre and Dfe may be the same or different.

Arbitrary delay generator N 115 receives nth input signal INN and provides Mth output signal OUTM. In the example shown in FIG. 1, nth input signal INN has a period TN with a low duty cycle, such as a PPS signal. Mth output signal OUTM has a rising edge delayed from input INN rising edge by nth rising edge delay DreN. Mth output signal OUTM has a falling edge delayed from input signal IN1 falling edge by nth falling edge delay DfeN. Mth output signal OUTM has a period T1D.

Delay control 120 may provide one or more control signals to arbitrary delay buffer 105. Delay control 120 may represent one or more hardware, firmware and/or software components in our out of arbitrary delay buffer 105 that lead to control of arbitrary delay buffer 105 or components therein, such as first arbitrary delay generator 110 and nth arbitrary delay generator 115. Control signals that may be provided by delay control may comprise, for example, signals that control selection of input signals for digital and/or analog delay, signals that control digital and/or analog stage oscillation frequency or frequencies, signals that control digital oscillation delay count, signals that control maintenance or modification of duty cycle and/or period, signals that control analog delay stage selections, signals that control selection of output signals, etc. Determination of control signals may be based on one or more characteristics of an input signal, a configuration of arbitrary delay buffer 105 or components therein and/or calibration of arbitrary delay buffer 105 or components therein.

Figure 2:
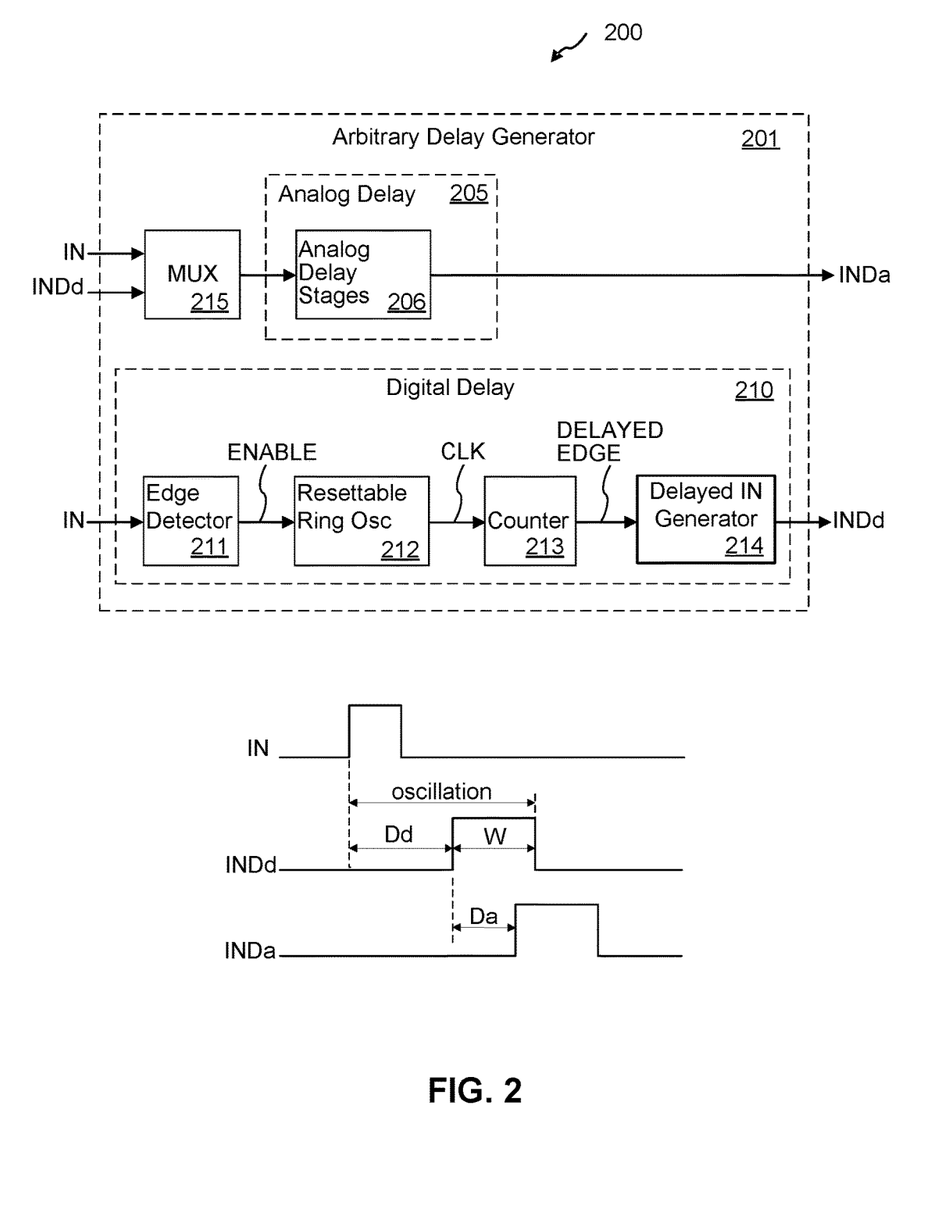
FIG. 2 is an example of an arbitrary delay generator with selectable and configurable digital and analog delays.

FIG. 2 is an example of an arbitrary delay generator with selectable and configurable digital and analog delays. An arbitrary delay generator may have one or more digital delay paths and one or more analog delay paths. An arbitrary delay generator may comprise one or more analog delays and one or more digital delays, which may be utilized alternatively, sequentially or in parallel (concurrently or simultaneously). Arbitrary delay generator 201 comprises analog delay 205, digital delay 210 and multiplexer 215. A delay may or may not be limited, e.g., to a period of an input signal.

Analog delay 205 may be configured (e.g. programmed), statically and/or dynamically, to delay (or even not to delay) one or more signals (e.g. selected by controlling multiplexer 215). Analog delay 205 may be calibrated. Analog delay 205 may comprise other functionality or components not shown in FIG. 2, such as calibration. In an example, analog delay 205 may comprise one or more examples of VCDL 60 or programmable delay generator 100 with calibration shown and described in U.S. patent application Ser. No. 14/887, 663, filed Oct. 20, 2015, entitled "INTEGRATED CIRCUITS HAVING LOW POWER, LOW INTERFERENCE AND PROGRAMMABLE DELAY GENERATORS THEREIN AND METHODS OF OPERATING SAME," hereinafter referred to as "the '663 application," which is hereby incorporated by reference in its entirety as if fully set forth herein.

Analog delay 205 may comprise one or more analog delay stages, such as analog delay stages 206 that delay a provided signal by analog delay Da. Analog delay stages 206 may be calibrated and/or configurable (e.g. to select or exclude stages). Analog delay stages 206 may comprise, for example, VCDL 60 in the '663 application. FIG. 4E in the '663 application shows a more detailed example of VCDL 60. Analog delay stages 206 may generate one or more selectable outputs, for example, as shown in FIG. 4E in the '663 application (e.g. S_d1, S_d2, S_d3, S_d4 . . . S_dn), which may provide various incremental delays of a signal provided to analog delay 205. In an example, selection of an incremental delay generated by analog delay stages 206 may be made by controlling a multiplexer, e.g., as indicated in FIG. 4E. In an (e.g. another) example, analog delay stages 206 may be configurable (e.g. programmable) to select and/or exclude various stages, which may be used, for example, to provide or select a delayed signal or signals without using a multiplexer. Delays provided by a stage may be the same or different relative to delays provided by other stages.

Digital delay 210 may provide a supplemental and/or an alternative delay relative to analog delay 205 or vice versa for input signal IN. In an example, digital and analog delays may provide fine and coarse delays or vice versa for input signal IN. In an example, analog delay 205 may provide delay up to a first delay time while digital delay 210 may provide delay beyond the first delay time or vice versa for input signal IN.

In an example, digital delay 210 comprises edge detector 211, resettable ring oscillator 212, counter 213 and delayed input signal (IN) generator 214. Other examples may implement digital delay 210 with the same or different components or functions. Other examples may have more or fewer components or functions.

Edge detector 211 may detect an edge (e.g. rising, falling edge) of input signal IN. An edge detector may comprise, for example, a D flip flop configured with its input set to one and configured to be clocked by an input signal. The output of the D flip flop may be subsequently cleared to detect subsequent rising edges. Other implementations may implement the same or different configurations of a D flip flop or may implement other edge detectors. An output of edge detector may provide an enable signal, e.g., to resettable ring oscillator 212.

Resettable ring oscillator 212 may be configured to oscillate, e.g., in response to an enable signal provided by edge detector 212. Resettable ring oscillator 212 may oscillate, for example, from a detected edge, during a digital delay Dd and during a pulse width W, which may or may not be the same as a pulse width for input signal IN. A pulse width or duty cycle of input signal IN may be detected by detecting rising and falling edges of input signal IN, which may be utilized to maintain or change a pulse width or duty cycle of input signal IN. Oscillations of resettable ring oscillator 212 may generate a clock CLK, e.g., to count the oscillations. Resettable ring oscillator 212 may be set and reset (e.g. enabled and disabled), for example, by one or more edge detection signals provided by edge detector 211 and/or one or more oscillation count signals. Resettable ring oscillator 212 may be calibrated for example, similar to calibration provided by programmable delay generator 100 for VCDL 60 in the '663 application. Ring oscillator frequency calibration may be performed, for example, using a binary search. A resettable ring oscillator may be divided down to compare to a reference (e.g. an embedded 25 MHz crystal oscillator). A digital code may be generated and provided to a DAC based on a comparison. A divided resettable ring oscillator frequency faster than the reference may generate a logic low (0) code while a resettable ring oscillator frequency equal to or slower than the reference may generate a logic high (1) code. The binary search may be repeated N times.

Counter 213 may provide one or more counters to count the number of oscillations of one or more resettable ring oscillators. Counter 213 may receive a clock CLK signal from resettable ring oscillator 212. Clock CLK may indicate oscillations of resettable ring oscillator 212. Counter 212 may be clocked by clock CLK, counting the oscillations of clock CLK for comparison to one or more predefined clock counts A clock count may be a predefined count that provides for one or both a digital delay Dd and a pulse width W (which may or may not match a pulse width of input signal IN). Counter 213 may provide one or more delayed edge signals, e.g., a delayed rising edge and a delayed falling edge.

Delayed input signal (IN) generator 214 may generate digitally delayed input signal INDd, for example, using one or more delayed edge signals provided by counter 213. FIG. 2 provides an example of digitally delay input signal INDd relative to input signal IN. In an example, digitally delayed input signal generator 214 may comprise an SR flip flop.

Multiplexer 215 may provide two or more signals to choose/select to provide as input to analog delay 205. In an example, multiplexor 215 may be controlled to select between input signal IN and digitally delayed input signal INDd to be received by analog delay 205. Multiplexer 215 may permit configuration of arbitrary delay generator 201 to provide an analog delay and/or a digital and analog delay to input signal IN. For example, as shown in FIG. 2, analog delay Da may be the only delay provided to input signal IN or it may be in addition to digital delay Dd provided to input signal IN. Other implementations may implement none, one or more input and/or output multiplexers or other configurable/controllable components. For example, an input multiplexer may provide a choice between input signal IN and analog delayed signal as input to a digital delay, which may permit configuration of arbitrary delay generator 201 to provide a digital delay and/or an analog and a digital delay to input signal IN. In an (e.g. another) example, an output multiplexer may be provided, for example, to provide a choice/selection to output one or more of input signal IN, digitally delayed input signal, an analog delayed input signal and/or a digitally and analog delay input signal.

In an example, an input signal may have a frequency of 250 MHz with a period of 4 ns. An analog delay 205 may comprise 20 (e.g. identical) delay stages in a ring oscillator. Each stage may be, for example, 250 ps. An analog ring oscillator may be calibrated to have a nominal period (e.g. 1 ns). In an example implementation, an analog delay may be used to delay input signals having a frequency greater than 250 MHz while a digital delay (e.g. alone or in addition to an analog delay) may be used to delay signals with a frequency lower than 250 MHz. An input signal may be delayed by analog delay 205, for example, when a targeted delay is less than 5 ns. An input signal may be delayed by analog delay 205 and digital delay 210, for example, when a targeted delay is greater than 4 ns. A digital delay may be referred to as a regenerated mode where a regenerated input signal (e.g. digitally delayed input signal) is provided to the analog delay (e.g. for additional delay). In an example, a counter (or delayed input generator) may generate a logic high while a count is between digital delay Dd and digital delay Dd plus pulse width W minus one period T (i.e. between D and D+W−T). The regenerated (delayed) input signal is provided to analog delay 205. The resettable ring oscillator may oscillate from a detected rising edge of the input signal until being reset when the counter reaches a count of digital delay Dd plus pulse width W. In an example of an implementation with a regeneration mode a delay may be less than an input period T minus pulse width W multiplied by resettable ring oscillator oscillation period Tosc, which may be the same as calibration Tdco. In an example implementation, a digital delay may be 80% or less than an input period T. In an example, an input signal with a 1 MHz frequency and 1 us period may be delayed digitally up to one period (1 us) while a total or cumulative delay (e.g. digital plus analog delays) may be equal to or greater than input period T. Pulse width W may be maintained or changed by determining parameter W, which may be extracted by counting a duration that an input signal is logic high.

Calibration may occur at a system level. A ring oscillator may be calibrated using (e.g. an embedded or integrated) crystal oscillator. A code, which may be optimized through testing, may be written for a DCO in a lot, for example, when accuracy may be relaxed and a maximum delay may be less than half a period of an input signal. A one-time-programmable (OTP) on-chip may be used for the code. In an example with a buffer having 250 ps steps, input signal phase alignment at different receivers may be within a range of 250 ps. Resettable ring oscillators may be replicas of a digital calibrated ring oscillator, e.g., to calibrate oscillation period accuracy. In an example, a digital delay may be arbitrary, e.g., from 0 to [Tinput/T_dco]. An analog delay may have a 4 ns range (e.g. 16 steps of 250 ps unit-step size) while a period of a digitally controlled oscillator (T_dco) may be calibrated to 2 nS. T_dco may be, for example, 1 nS, 500 ps, 4 nS, etc. An analog delay range may be larger than T_dco in an implementation with full input signal cycle delay. An 80% input cycle may be set to a maximum delay (nominal), for example, considering mismatch limitations and PVT drifting. A delay may vary, for example, by 10% over temperature. Process variations may be removed through calibration. Supply variations may be suppressed through on-die regulation. Post-fabrication adjustment may be incorporated, for example, to extend a maximum delay, e.g., to a full input cycle, e.g., even considering mismatch limitations and PVT drifting. Input signal duty cycle and period may be maintained by a digital delay with and without an analog delay. An input signal pulse width may be larger than a digitally controlled oscillator period (T_dco), for example, to provide a maximum frequency less than or equal to ½/T_dco. An input signal having a frequency higher than ½/T_dco may be delayed by the analog delay.

Advantages of digital delay (e.g. edge detection, oscillation counting and resetting), for example in addition to analog delay, may be repeatability and extended range of delay. Input signal sampling techniques may lack repeatability (e.g. due to meta-stability in sampling).

Figure 3:
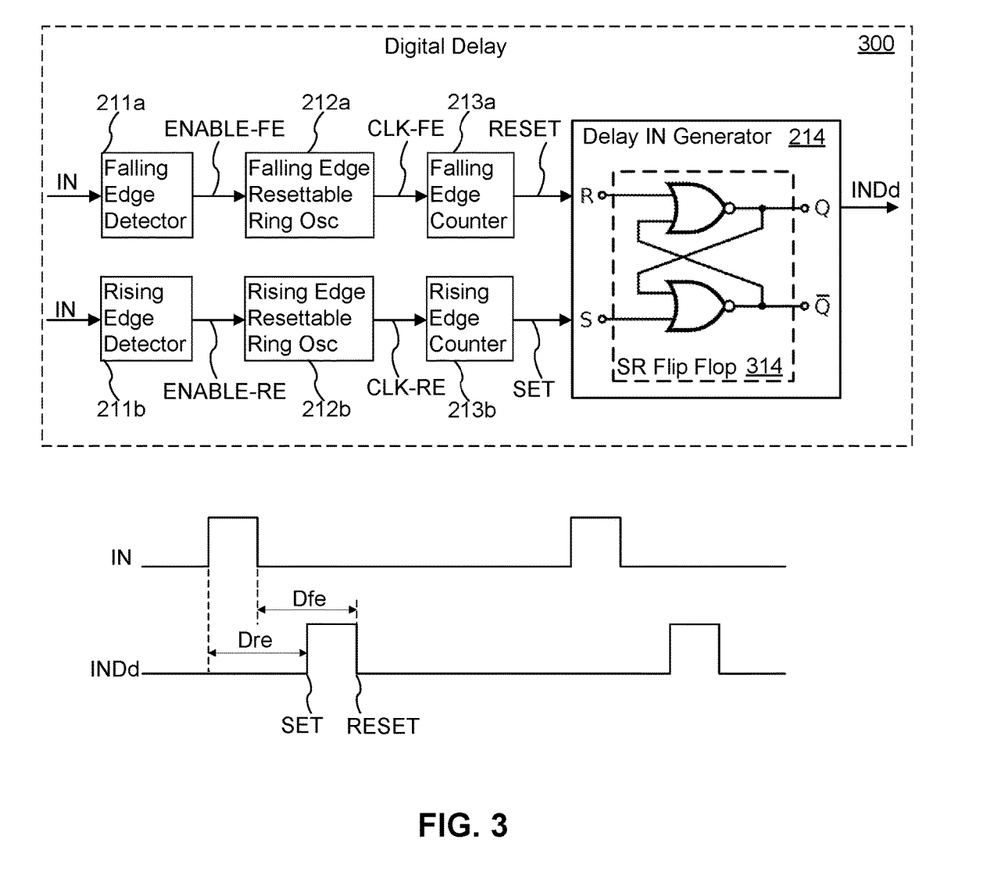
FIG. 3 is an example of a digital delay.

FIG. 3 is an example of a digital delay. Digital delay 300 is an example that may be implemented as an alternative to digital delay example 210 or as an example providing more detail of digital delay example 210. In other words, implementations may implement one or more edge detectors and logic associated with one or more edge detectors. In an example, digital delay 300 may comprise one or more rising edge paths and one or more falling edge paths. Rising and falling edge paths may be used, for example, to detect a pulse width or duty cycle of an input signal. A pulse width may be maintained or changed (e.g. corrected) while generating one or more delayed versions of an input signal.

In an example, digital delay 300 comprises falling edge detector 211*a*, falling edge resettable ring oscillator 212*a*, falling edge counter 213*a*, rising edge detector 211*b*, rising edge resettable ring oscillator 212*b*, rising edge counter 213*b* and delayed input signal (IN) generator 214. Other examples may implement digital delay 300 with the same or different components or functions. Other examples may have more or fewer components or functions.

Falling edge detector 211*a* may detect a falling edge of input signal IN. A falling edge detector may comprise, for example, a negative edge triggered D flip flop configured with its input set to one and configured to be clocked by input signal IN. The output of the D flip flop may be subsequently cleared to detect subsequent falling edges. Other implementations may implement the same or different configurations of a D flip flop or may implement other edge detectors. An output of falling edge detector 211*a* may provide a falling edge enable signal enable-fe, e.g., to enable and disable falling edge resettable ring oscillator 212*a*.

Falling edge resettable ring oscillator 212*a* may be configured to oscillate, e.g., in response to an enable signal provided by falling edge detector 212*a*. Falling edge resettable ring oscillator 212*a* may oscillate, for example, from a detected falling edge, during a falling edge digital delay Dfe. Oscillations of falling edge resettable ring oscillator 212*a* may generate a falling edge clock CLK-fe, e.g., to count the oscillations from the falling edge detection. Falling edge resettable ring oscillator 212*a* may be set and reset (e.g. enabled and disabled), for example, by one or more edge detection signals provided by falling edge detector 211*a* (e.g. enable-fe) and/or one or more oscillation count signals. Falling edge resettable ring oscillator 212*a* may be calibrated for example, similar to calibration provided by programmable delay generator 100 for VCDL 60 in the '663 application.

Falling edge counter 213*a* may provide one or more counters to count the number of oscillations of falling edge resettable ring oscillator 212*a*. Falling edge counter 213*a* may receive falling edge clock CLK signal CLK-fe from falling edge resettable ring oscillator 212*a*. Falling edge clock CLK-fe may indicate oscillations of falling edge resettable ring oscillator 212*a* since the detection of a falling edge of input signal IN. Falling edge counter 212*a* may be clocked by falling edge clock CLK-fe, counting the oscillations of falling edge clock CLK-fe for comparison to one or more predefined falling edge clock counts A falling edge clock count may be a predefined count that provides a falling edge delay Dfe for the falling edge of input signal IN. Falling edge counter 213*a* may provide one or more delayed falling edge signals, such as RESET signal, to delayed input signal generator 214.

Rising edge detector 211*b* may detect a rising edge of input signal IN. A rising edge detector may comprise, for example, a positive (rising) edge triggered D flip flop configured with its input set to one and configured to be clocked by input signal IN. The output of the D flip flop may be subsequently cleared to detect subsequent rising edges. Other implementations may implement the same or different configurations of a D flip flop or may implement other edge detectors. An output of rising edge detector 211*b* may provide a rising edge enable signal enable-re, e.g., to enable and disable rising edge resettable ring oscillator 212*b*.

Rising edge resettable ring oscillator 212*b* may be configured to oscillate, e.g., in response to an enable signal provided by rising edge detector 212*b*. Rising edge resettable ring oscillator 212*b* may oscillate, for example, from a detected rising edge, during a rising edge digital delay Dre. Oscillations of rising edge resettable ring oscillator 212*b* may generate a rising edge clock CLK-re, e.g., to count the oscillations from the rising edge detection. Rising edge resettable ring oscillator 212*b* may be set and reset (e.g. enabled and disabled), for example, by one or more edge detection signals provided by rising edge detector 211*b* (e.g. enable-re) and/or one or more oscillation count signals. Rising edge resettable ring oscillator 212*b* may be calibrated for example, similar to calibration provided by programmable delay generator 100 for VCDL 60 in the '663 application.

Rising edge counter 213*b* may provide one or more counters to count the number of oscillations of rising edge resettable ring oscillator 212*b*. Rising edge counter 213*b* may receive rising edge clock CLK signal CLK-re from rising edge resettable ring oscillator 212*b*. Rising edge clock CLK-re may indicate oscillations of rising edge resettable ring oscillator 212*b* since the detection of a rising edge of input signal IN. Rising edge counter 213*b* may be clocked by rising edge clock CLK-re, counting the oscillations of rising edge clock CLK-re for comparison to one or more predefined rising edge clock counts. A rising edge clock count may be a predefined count that provides a rising edge delay Dre for the rising edge of input signal IN. Rising edge counter 213*b* may provide one or more delayed rising edge signals, such as SET signal, to delayed input signal generator 214.

Delayed input signal (IN) generator 214 may generate digitally delayed input signal INDd, for example, using rising and falling delayed edge signals (e.g. SET and RESET) generated, respectively, by rising edge counter 213*b* and falling edge counter 213*a*. FIG. 2 provides an example of digitally delay input signal INDd relative to input signal IN. A digitally delayed input signal INDd may or may not have the same pulse width, duty cycle and period as input signal IN. In an example, a rising edge delay Dre and falling edge delay Dfe may be defined (e.g. programmed) into rising and falling edge counters 212*b*, 212*a* to maintain the pulse width, duty cycle and period of input signal IN. In an example, digitally delayed input signal generator 214 may comprise an SR flip flop 314. SET and RESET signals may set and reset SR flip flop 314 to generate digitally delayed input signal INDd.

Figure 4:
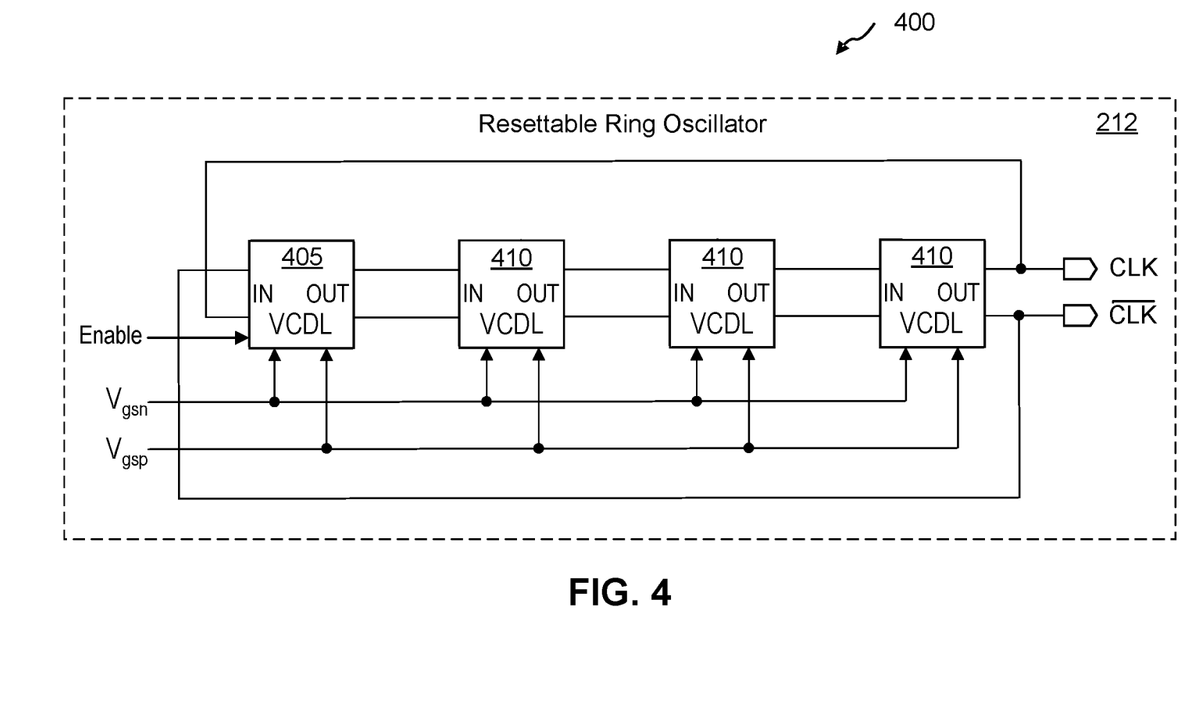
FIG. 4 is an example of a resettable ring oscillator.

FIG. 4 is an example of a resettable ring oscillator. Resettable ring oscillator 400 is provided as one of many examples of resettable ring oscillator 212, falling edge resettable ring oscillator 212a and rising edge resettable ring oscillator 212b. Resettable ring oscillator may comprise one or more oscillation components, such as VCDL stages.

In an example, resettable ring oscillator 212 may comprise at least one resettable VCDL stage, such as resettable VCDL stage 405. Resettable ring oscillator 212 may comprise other stages, such as non-resettable VCDL stages 410. Control signals such as Vgsn and Vgsp may set a frequency of oscillation of resettable VCDL stage 405 and non-resettable VCDL stages 410 and, therefore a frequency of the output of resettable ring oscillator 212, i.e., CLK and complementary signal CLK!. Control signals Vgsn and Vgsp may be common to all stages or may be unique to each stage. Control signals Vgsn and Vgsp may be adjusted, for example, based on calibration. Control signals such as ENABLE may enable and disable resettable VCDL stage 405, e.g., to start and end oscillation of resettable ring oscillator 212.

FIGS. 4A-C and discussion thereof in the '663 application provide examples of non-resettable VCDL stages 410.

Figure 5A:
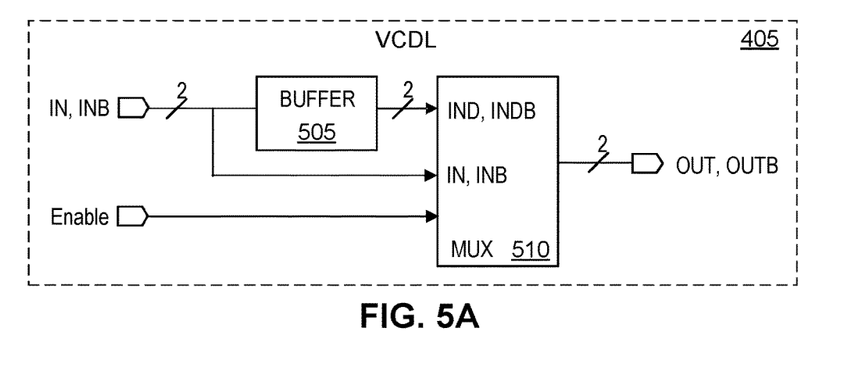
FIGS. 5A-C are examples of an oscillator stage in a resettable ring oscillator.
Figure 5B:
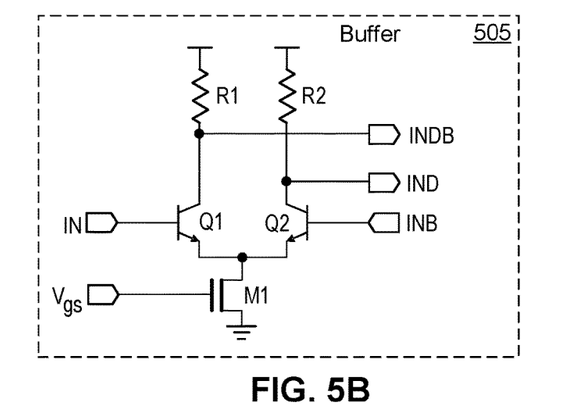
Figure 5C:
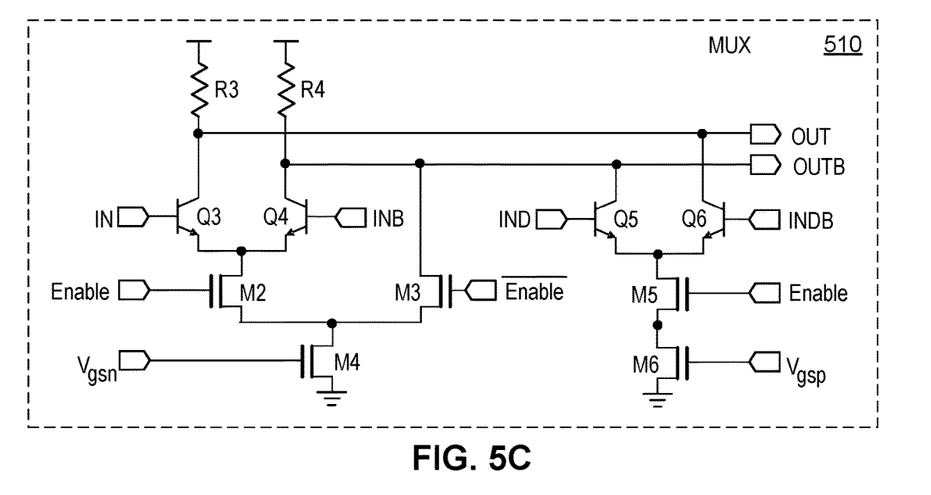

FIGS. 5A-C are examples of an oscillator stage in a resettable ring oscillator. FIGS. 5A-C provide examples of resettable VCDL stage 405 in FIG. 4.

FIG. 5A presents an example of resettable VCDL stage 405. In an example, resettable VCDL stage 405 comprises buffer 505 and multiplexer (mux) 510. A magnitude of delay may be controlled by one or more control signals, e.g., Vgs, Vgsn and Vgsp. VCDL stage 405 may be enabled and disabled by one or more control signals, e.g., enable signal.

Buffer 505 receives differential input signal IN, INB. Buffer 505 may be controlled to provide a predefined delay to differential input signal IN, INB. Buffer 505 outputs delayed differential input signal IND, INDB. Buffer may receive one or more control signals.

Multiplexer 510 may be referred to as a voltage controlled delay (VCD). Multiplexer 510 receives differential input signal IN, INB and, from buffer 505, delayed differential input signal IND, INDB. Multiplexer 510 may receive one or more control signals. Multiplexer 510 outputs differential output OUT, OUTB.

FIG. 5B is an example of buffer 505. Buffer 505 may be implemented in BiCMOS technology. Buffer 505 may comprise, for example, NPN BJT transistors Q1 and Q2, n-channel MOSFET (NMOS) transistor M1 and resistors R1 and R2. Differential input signal IN, INB may be provided to respective base nodes of NPN BJT transistors Q1 and Q2. Resistors R1 and R2 may be coupled between a supply voltage and respective collector nodes of NPN BJT transistors Q1 and Q2. Differential output IND and INDB are coupled to respective collector nodes of NPN BJT transistors Q2 and Q1. Emitter nodes of NPN BJT transistors Q1 and Q2 may be coupled together and to a drain node of NMOS transistor M1. A source node of NMOS transistor M1 may be coupled to ground. A gate node of NMOS transistor M1 may be coupled to buffer control signal Vgs.

Buffer control signal Vgs may control the operation of and delay provided by buffer 505, e.g., by controlling delay time. In an example, buffer control signal Vgs may have a fixed magnitude, e.g., to provide a constant delay. NMOS transistor M1 with gate-source voltage Vgs may function as a current source while differential input pair Q1-Q2 may function to steer current from the current source to differential output IND, INDB. Buffer 505 may have a delay time Td_buf>0, for example, due to resistive load provided by resistors R1 and R2, limited conductance (gm) of differential input transistors Q1 and Q2, parasitic routing capacitance and input capacitance of NPN transistors Q5 and Q6 in multiplexer 510.

FIG. 5C is an example of multiplexer 510. Multiplexer 510 may be implemented in BiCMOS technology. Multiplexer 510 may comprise, for example, npn BJT transistors Q3, Q4, Q5 and Q6, n-channel MOSFET (NMOS) transistors M2, M3, M4, M5 AND M6 and resistors R3 and R4. Differential input signal IN, INB may be provided to respective base nodes of npn BJT transistors Q3 and Q4. Delayed differential input signal IND, INDB may be provided to respective base nodes of npn BJT transistors Q5 and Q6. Collector nodes of npn BJT transistors Q3 and Q6 may be coupled together. Collector nodes of npn BJT transistors Q4 and Q5 may be coupled together. Resistor R3 may be coupled between a supply voltage and collector nodes of npn BJT transistors Q3 and Q6. Resistor R4 may be coupled between a supply voltage and collector nodes of npn BJT transistors Q4 and Q5. Differential output OUT may be coupled to collector nodes of npn BJT transistors Q3 and Q6. Differential output OUTB may be coupled to collector nodes of npn BJT transistors Q4 and Q5. Emitter nodes of npn BJT transistors Q3 and Q4 may be coupled together and to a drain node of NMOS transistor M2. Emitter nodes of npn BJT transistors Q5 and Q6 may be coupled together and to a drain node of NMOS transistor M5. A drain node of NMOS transistor M3 may be coupled to differential output OUTB. Source nodes of NMOS transistors M2 and M3 may be coupled together and to a drain node of NOMS transistor M4. A source node of NMOS transistor M5 may be coupled to a drain node of NMOS transistor M6. A source node of NMOS transistor M4 may be coupled to ground. A source node of NMOS transistor M6 may be coupled to ground. A gate node of NMOS transistor M2 may be coupled to control signal Enable. A gate node of NMOS transistor M3 may be coupled to control signal not enable (enable !). A gate node of NMOS transistor M4 may be coupled to a control signal Vgsn. A gate node of NMOS transistor M5 may be coupled to control signal Enable. A gate node of NMOS transistor M6 may be coupled to control signal Vgsp.

BJT pairs Q1-Q2, Q3-Q4 and Q5-Q6 provide differential amplifiers for a respective differential input signal. A switching speed of (e.g. a delay provided by) MOS transistors in buffer 505 and multiplexer 510 for respective differential input signals may be configured, e.g., according to a voltage magnitude of control signals Vgs, Vgsn and Vgsp. Control signals may be adjusted, e.g., in response to calibration.

Multiplexer 510 may be disabled, for example, when Enable=0, in which case OUT=VDD, OUTB=VDD−I*R provided to CLK, CLK! in FIG. 4, which resets resettable ring oscillator 212. When Enable=1, ring oscillator 212 may immediately start oscillation.

Multiplexer 510 has two differential inputs: first differential input pair comprising NPN transistors Q3 and Q4 and second differential input pair comprising NPN transistors Q5 and Q6. A first current source may comprise NMOS transistor M4 (with gate controlled by Vgsn) coupled to the common emitter of Q3 and Q4. A second current source may comprise NMOS transistor M6 (with gate controlled by Vgsp) coupled to the common emitter of Q5 and Q6. Vgsp and Vgsn may be adjustable, for example, by a current steering digital to analog converter (CSDAC). When Vgsp>Vgsn, the delay from delayed differential input signal IND, INDB to differential output OUT, OUTB may be smaller than the delay from differential input signal IN/INB to differential output OUT, OUTB. When Vgsn>>Vt>Vgsp, all current may go through Q3, Q4 and the delay from differential input IN, INB to differential output OUT, OUTB may be Td_mux. When Vgsn<Vt<<Vgsp, all current may go through Q5, Q6 and the delay from delayed differential input IND, INDB to differential output OUT, OUTB may be Td_mux. When Vgsn>Vt and Vgsp>Vt, both current sources may be conducting and the differential output OUT, OUTB may be controlled by both differential input IN, INB and delayed differential input IND, INDB. Current control through Vgsp and Vgsn may ensure I_M4+I_M6=constant.

With reference to examples in FIGS. 5A and 5C, from differential input IN, INB to differential output OUT, OUTB direct through multiplexer 510, all current goes through M4 (controlled by Vgsn) and VCDL 405 has a minimal delay of Td_mux provided by multiplexer 510. When all current goes through M6 (controlled by Vgsp), VCDL 405 has a maximum delay of Td_mux+Td_buf (combined delays provided by buffer 505 and multiplexer 510). When adjusting Vgsp, Vgsn, e.g., using a CSDAC, the delay from differential input IN, INB to differential output OUT, OUTB may be between Td_mux and Td_mux+Td_buf. The larger the magnitude of Vgsp−Vgsn, the longer delay.

Figure 6:
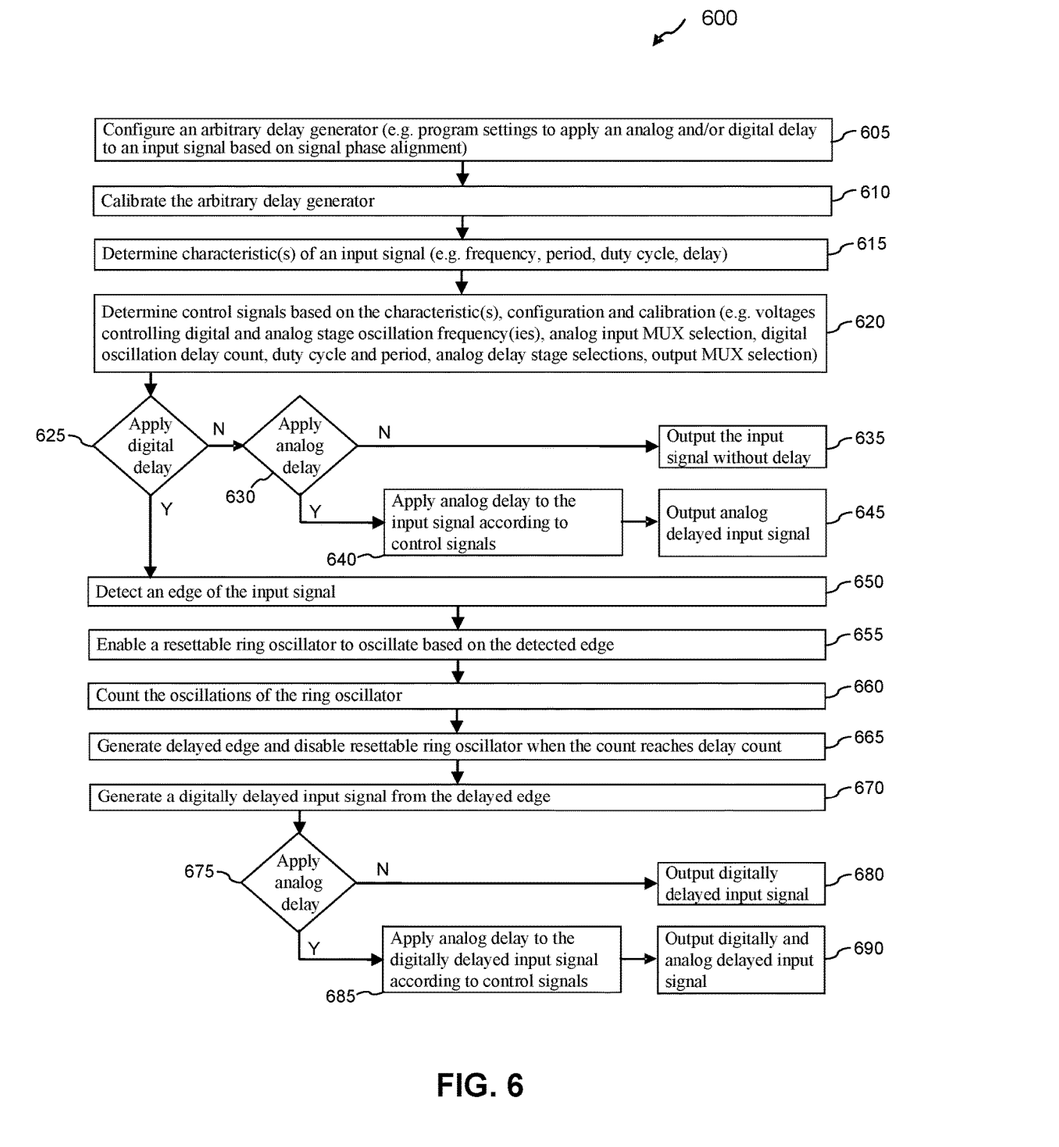
FIG. 6 is an example of arbitrary delay buffer operation.

An arbitrary delay buffer may be implemented, at least in part, in the form of operation, procedures or methods. FIG. 6 is an example of arbitrary delay buffer operation. Example method 600 comprises example steps 605-690. No order of steps is required unless expressly indicated or inherently required. There is no requirement that an implementation implement all of the operations illustrated in the example shown in FIG. 6. Other implementations may implement one or more of the example operations shown in FIG. 6 in any order with or without other operations. FIG. 6 is simply one of many possible examples of subject matter disclosed herein. Embodiments may implement fewer, more or different steps.

In example step 605, an arbitrary delay generator may be configured (e.g. programmed). For example, as shown and discussed with respect to FIGS. 1-5, delay control 120 may configure one or more arbitrary delay generators with analog delay 205 and digital delay 210 to generate one or more outputs by applying to one or more input signals (i) no delay, (ii) a digital delay, (iii) an analog delay or (iv) a digital and an analog delay. Configured settings may, for example, be based on a number of receivers, a number of inputs and outputs, estimated delays to provide signal phase alignment at each receiver receiving one or more signals provided by one or more arbitrary delay generators. A configured setting may be, for example, a selection of one or more arbitrary delay generators, a selection of inputs and outputs for one or more arbitrary delay generators, a selection for multiplexer 215 and a selection of an output as one or more of one or more output signals with (i) no delay, (ii) a digital delay, (iii) an analog delay or (iv) a digital and an analog delay.

In example step 610, an arbitrary delay generator may be calibrated. For example, as shown and discussed with respect to FIGS. 1-5, ring oscillator (e.g. VCDL) stages and resettable ring oscillator (e.g. VCDL) stages in digital delay 205 and/or analog delay 210 may be calibrated. Calibration may occur during and/or after fabrication. Calibration may be static (e.g. while not in operation) and/or dynamic (e.g. while in operation), e.g., to provide compensation for performance variation due to process, voltage and temperature variation. An example of calibration for VCDL stages is provided in the '663 application. See, e.g., FIG. 1 of the '663 application showing calibration for VCDL 60. Calibration may be a factor in determining configured settings (e.g. control signals). In an example, calibration may be implemented in delay control 120. In an (e.g. another) example, delay control 120 may be provided with calibration information, e.g., calibration codes.

In example step 615, a determination may be made about characteristic(s) of an input signal (e.g. frequency, period, duty cycle). For example, as shown and discussed with respect to FIGS. 1-5, delay control 120 may determine or be provided with information about the characteristics of one or more input signals.

In example step 620, one or more control signals may be determined, e.g., based on configuration, calibration and characteristics in steps 605-615. For example, as shown and discussed with respect to FIGS. 1-5, delay control 120 may determine control signals, such as signals that control selection of input signals for digital and/or analog delay, signals that control digital and/or analog stage oscillation frequency or frequencies, signals that control digital oscillation delay count, signals that control maintenance or modification of duty cycle and/or period, signals that control analog delay stage selections, signals that control selection of output signals, etc. For example, delay control 120 may provide to arbitrary delay buffer 105 (and to one or more arbitrary delay buffers 1 through N therein) one or more control signals (e.g. analog delay Da, digital delay Dd, output signal pulse width W, delay period TD, oscillation count for rising edge delay Dre, oscillation count for falling edge delay Dfe, VCDL control signals Vgs, Vgsn, Vgsp for digital and analog ring oscillator stages and resettable ring oscillator stages) to arbitrary delay buffer 105. Determination of control signals may be based on one or more algorithms with logic based on one or more of delay generator configuration, delay generator calibration and characteristics of an input signal (e.g. a period or frequency and/or duty cycle of an input signal or a delay for the input signal).

Output signals may be determined from control signals, for example, according to example steps 625-690.

In example step 625, a decision may be made whether to apply a digital delay to an input signal. For example, as shown and discussed with respect to FIGS. 1-5, a control signal (e.g. provided by delay control 120) may indicate whether a digital delay is applied to an input signal. A procedure may proceed to step 630 when a digital delay is not applied to an input signal or to step 650 when a digital delay is applied to an input signal.

In example step 630, a decision may be made whether to apply an analog delay to an input signal. For example, as shown and discussed with respect to FIGS. 1-5, a control signal (e.g. provided by delay control 120) may indicate whether an analog delay is applied to an input signal. A procedure may proceed to step 635 when an analog delay is not applied to an input signal or to step 640 when an analog delay is applied to an input signal.

In example step 635, an arbitrary delay generator may output an input signal without any delay according to control signals. For example, as shown and discussed with respect to FIGS. 1-5, nth input signal INN may be provided to Mth output OUTM without digital or analog delay.

In example step 640, an analog delay may be applied to an input signal according to control signals. For example, as shown and discussed with respect to FIGS. 1-5 and FIGS.

1-4E in the '663 application, one or more stages in analog delay stages 207 may be selected for application to input signal IN.

In example step 645, an arbitrary delay generator may output an input signal with an analog delay. For example, as shown and discussed with respect to FIGS. 1-5 and FIGS. 1-4E in the '663 application, nth input signal INN may be provided to Mth output OUTM with an analog delay and without a digital delay.

In example step 650 where a digital delay is being applied to an input signal, an edge of the input signal may be detected. For example, as shown and discussed with respect to FIGS. 1-5, an edge detector (e.g. 211, 211*a*, 211*b*) may detect a rising and/or falling edge of an input signal.

In example step 655, a resettable ring oscillator may be enabled to oscillate based on the detected edge. For example, as shown and discussed with respect to FIGS. 1-5, a resettable ring oscillator (e.g. 212, 212*a*, 212*b*) may oscillate in response to detection of a rising or falling edge of an input signal.

In example step 660, oscillations of the ring oscillator may be counted. For example, as shown and discussed with respect to FIGS. 1-5, a counter (e.g. 213, 213*a*, 213*b*) may count oscillations of a ring oscillator.

In example step 665, a delayed edge may be generated and a resettable ring oscillator may be disabled when the count reaches a delay count. For example, as shown and discussed with respect to FIGS. 1-5, a control signal may specify one or more delay counts based on a configuration, calibration and input signal characteristics in order to apply a predetermined digital delay to an input signal. A counter (e.g. 213, 213*a*, 213*b*) may count oscillations of a resettable ring oscillator to the delayed count and generate a delayed rising or falling edge, which may disable a counter.

In example step 670, a digitally delayed input signal is generated from one or more delayed edges. For example, as shown and discussed with respect to FIGS. 1-5, delayed input generator 214 (e.g. SR flip flop 314) may generate a digitally delayed input signal INDd from one or more delayed edge signals (e.g. set, reset).

In example step 675, a decision may be made whether to apply an analog delay to a digitally delayed input signal. For example, as shown and discussed with respect to FIGS. 1-5, a control signal (e.g. provided by delay control 120) may indicate whether an analog delay is applied to a digitally delayed input signal. MUX 215 may be controlled to provide input signal IN or digitally delayed input signal INDd to analog delay 205. A procedure may proceed to step 680 when an analog delay is not applied to a digitally delayed input signal or to step 685 when an analog delay is applied to a digitally delayed input signal.

In example step 680, an arbitrary delay generator may output an input signal with a digital delay but not an analog delay according to control signals. For example, as shown and discussed with respect to FIGS. 1-5, nth input signal INN may be provided to Mth output OUTM with a digital delay but not an analog delay.

In example step 685, an analog delay may be applied to a digitally delayed input signal according to control signals. For example, as shown and discussed with respect to FIGS. 1-5 and FIGS. 1-4E in the '663 application, one or more stages in analog delay stages 207 may be selected for application to digitally delayed input signal INDd to apply an analog delay Da thereto.

In example step 690, an arbitrary delay generator may output an input signal with both a digital delay and an analog delay. For example, as shown and discussed with respect to FIGS. 1-5 and FIGS. 1-4E in the '663 application, nth input signal INN may be provided to Mth output OUTM with both a digital delay Dd and an analog delay Da.

Systems, methods, and instrumentalities have been disclosed for an arbitrary delay buffer. A signal (e.g. 1 PPS signal) may be arbitrarily delayed in discrete steps (e.g. to a full cycle). A signal may be arbitrarily delayed in discrete steps by an arbitrary delay buffer having one or more arbitrary delay generators with one or more inputs and outputs, which may be independently delayed. An arbitrary delay buffer may have an analog delay and a digital delay. An analog delay may have a number of selectable delay stages (e.g. ring oscillator with VCDL stages). A digital delay may have rising and falling edge detectors, resettable ring oscillators that oscillate in response to rising or falling edges and counters to count oscillations and generate rising and falling edge delay signals when oscillation counts reach rising and falling edge delay counts, which may be selected to maintain a duty cycle and a period of the input signal in the delayed signal. Selection of one or both of the digital and analog delays and their respective delay times to delay a signal may be based on one or more characteristics. For example, an analog delay may selectively receive an input signal or a delayed input signal from the digital delay for original or additional delay based on input signal frequency or total delay. A resettable ring oscillator may have one or more stages (e.g. VCDLs) that may be enabled and disabled. Ring oscillators or stages therein in analog and digital delays may be calibrated, for example, by adjusting reference voltages based on calibration of replica ring oscillators or stages.

A device (e.g., apparatus, manufacture, machine) may be digital, analog or a combination thereof. Devices may be implemented with any one or more semiconductor processes or semiconductor technology, including one or more of BJT, HBT, MOSFET, MESFET, CMOS, BiCMOS, RF SOI or other transconductor or transistor technology. Implementation with different technologies may require alternative configurations other than the configuration illustrated in embodiments presented herein, which is within the knowledge of one of ordinary skill. Devices may be implemented in any discrete or integrated circuit fabrication technology, including but not limited to Silicon-Germanium (SiGe) semiconductors or other semiconductors comprising other materials and alloys.

Techniques described herein may be implemented in hardware (digital and/or analog) or a combination of hardware, software and/or firmware. Techniques described herein may be implemented in one or more components. Embodiments of the disclosed subject matter may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media.

Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions (e.g. a microprocessor or micro controller with instructions in embedded memory) that, when executed, provide and/or maintain one or more aspects of functionality described herein with reference to FIGS. 1-13, as well as any and all components, steps and functions therein and/or further embodiments of the present technology described herein. While the disclosed technology has been described with respect to a limited number of examples, it should be understood that they have been presented by way of example only, and not limitation. It will be understood by those skilled in the relevant art(s) that the spirit and scope of the subject matter of the present application encompasses a wide variety of implementations, including various changes in form and details to disclosed examples.

Embodiments are not limited to the functional blocks, detailed examples, steps, order or the entirety of subject matter presented in the examples. An embodiment of a device, apparatus or machine may comprise any one or more features described herein in any configuration. An embodiment of a method or process may comprise any process described herein, in any order, with any number of steps, using any modality.

Proper interpretation of subject matter claimed in this patent application is limited to patentable subject matter under 35 U.S.C. § 101. As claimed, a procedure (e.g. method) is a process defined by 35 U.S.C. § 101 and each of a circuit, device, apparatus, machine, system, computer, module, media and the like is a machine and/or manufacture defined by 35 U.S.C. § 101.

The appended claims encompass examples and features described herein, modifications and variations thereto as well as additional examples and features that fall within the true spirit and scope of the disclosed subject matter.

What is claimed:

1. An apparatus comprising:
a delay generator configured to provide both or select between (i) a digital delay combined with an analog delay of an input signal and (ii) the analog delay without the digital delay of the input signal.

2. The apparatus of claim 1, wherein the digital delay comprises:
an edge detector that detects at least one of a rising edge and a falling edge (a detected edge) of the input signal;
a ring oscillator that oscillates in response to the detected edge; and
a counter that counts the number of oscillations of the ring oscillator in response to the detected edge and generates a delay signal when the count reaches a delay count that determines the duration of the oscillation.

3. The apparatus of claim 2, wherein
the edge detector comprises a rising edge detector that detects a rising edge of the input signal and a falling edge detector that detects a falling edge of the input signal;
the ring oscillator comprises a first ring oscillator that oscillates in response to the detected rising edge and a second ring oscillator that oscillates in response to the detected falling edge; and
the counter comprises a first counter that counts a number of oscillations of the first ring oscillator and generates a first delay signal when the count reaches a first delay count and a second counter that counts the number of oscillations of the second ring oscillator and generates a second delay signal when the count reaches a second delay count.

4. The apparatus of claim 3, further comprising:
a delayed input signal generator configured to generate a delayed version of the input signal (a delayed input signal) in response to the first and second delay signals.

5. The apparatus of claim 4, wherein the delayed input signal generator comprises a set-reset flip flop that receives the first delay signal as a set signal and the second delay signal as a reset signal.

6. The apparatus of claim 4, wherein the first delay count and the second delay count are programmed to maintain a duty cycle and a period of the input signal in the delayed input signal.

7. The apparatus of claim 4, further comprising:
the analog delay configured to provide the analog delay with and without the digital delay to the input signal.

8. The apparatus of claim 7, further comprising:
a controller that selects between application of the analog delay, the digital delay and a combination of the analog delay and the digital delay to the input signal.

9. The apparatus of claim 4, further comprising:
a multiplexer that receives as inputs the input signal and one of the delayed input signal and the delay signal generated by the counter; and
an analog delay configured to selectively provide the analog delay to one of the input signal and the delayed input signal or delay the input signal based on the delay signal generated by the counter.

10. The apparatus of claim 2, the ring oscillator being resettable, wherein the resettable ring oscillator comprises:
a resettable oscillator stage configured to be enabled and disabled responsive to an enable signal.

11. The apparatus of claim 10, wherein the resettable oscillator stage comprises a voltage controlled delay line (VCDL).

12. The apparatus of claim 11, wherein a multiplexer in the VCDL is configured to be enabled and disabled responsive to the enable signal.

13. The apparatus of claim 12, further comprising:
a calibration circuit that calibrates a replica VCDL, which calibration is used to control the VCDL in the resettable oscillator stage.

14. A method comprising:
selecting between application of an analog delay and a combination of the analog delay and a digital delay to an input signal; and
applying the selected delay to the input signal.

15. The method of claim 14, wherein the selection is based on a frequency of the input signal or a length of a delay applied to the input signal.

16. The method of claim 14, wherein application of the selected delay to the input signal comprises at least one of:
applying, based on the selection, the digital delay by:
detecting at least one of a rising edge and a falling edge (a detected edge) of the input signal;
oscillating, by a ring oscillator, in response to the detected edge;
counting a number of oscillations of the ring oscillator in response to the detected edge and generating a delay signal when the count reaches a delay count; and applying, based on the selection, the analog delay by:
applying at least one of a plurality of analog delay stages in the analog delay: (i) to the input signal, (ii) to the input signal based on the delay signal or (iii) to a delayed version of the input signal generated based on the delay signal.

17. The method of claim 16, further comprising:
operating and resetting the ring oscillator by enabling and disabling the ring oscillator or a ring oscillator stage in the ring oscillator.

18. The method of claim 16, further comprising:
selecting a number of the analog delay stages in the analog delay; and
selecting the delay count for the counter in the digital delay.

19. An apparatus comprising:
a digital delay configured to receive an input signal; and
an analog delay configured to selectively receive, based on a selection signal, one of the input signal and an output of the digital delay,
wherein the selection signal selects between application of one and both the analog delay and the digital delay to the input signal.

20. The apparatus of claim 19, wherein the digital delay comprises:
an edge detector configured to receive the input signal;
a resettable ring oscillator coupled to an output of the edge detector; and
a counter coupled to an output of the resettable ring oscillator.

* * * * *